AMPLIFIER FOR AUTOMATIC GAIN CONTROL VOLTAGE
Filed Feb. 1, 1954
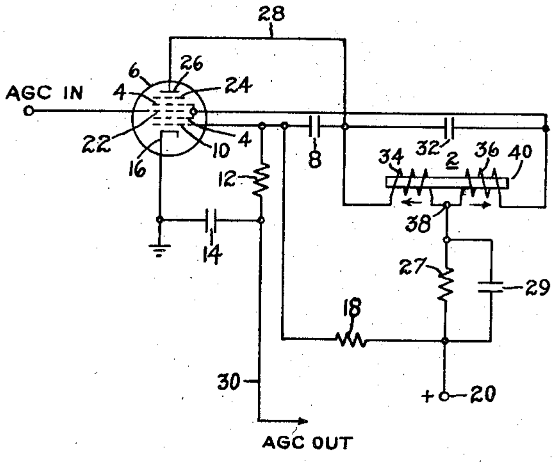
Inventor:
Wolf J. Gruen,
by Donald M. Timlie
His Attorney.

United States Patent Office 2,848,562

Patented Aug. 19, 1958

2,848,562

AMPLIFIER FOR AUTOMATIC GAIN CONTROL VOLTAGE

Wolf J. Gruen, Syracuse, N. Y., assignor to General Electric Company, a corporation of New York Application February 1, 1954, Serial No. 407,447

6 Claims. (Cl. 179—171)

This invention relates to an improved and simplified amplifier for automatic gain control voltage that has an easily adjusted amount of delay.

A. G. C. voltages of a desired negative polarity are easily obtained in most receivers. If a direct current amplifier is used to increase their amplitude, two stages are generally required in order to preserve the negative polarity. It has been suggested that the negative voltage of a grid of an oscillator could be used as the amplified A. G. C. voltage if the gain of the oscillator is controlled in response to an unamplified positive A. G. C. voltage.

In accordance with one of the objects of this invention, however, the negative voltage appearing at the grid of an oscillator is used as the amplified A. G. C. voltage but the amplitude of the oscillation (to which the grid voltage is proportional) is controlled by the easily obtained unamplified negative A. G. C. voltage.

Briefly, this objective may be obtained in the following manner. An oscillatory system is provided that has a regenerative path that aids in setting up and increasing the amplitude of oscillations and a degenerative path that tends to decrease the amplitude of oscillations. The available negative unamplified A. G. C. voltage is applied to reduce the gain of the degenerative path as its amplitude increases. Hence as signals derived by a receiver increase in amplitude, the unamplified A. G. C. voltage becomes increasingly negative, the gain of the degenerative path is reduced, the amplitude of the oscillations increases and the negative voltage at an electrode of the oscillator increases so as to provide a suitable amplified A. G. C. voltage.

In one preferred embodiment of the invention, delay in the A. G. C. voltage is attained by placing an iron core in such manner that its position can alter the relative impedance of the regenerative and degenerative paths.

The manner in which these objectives, as well as other objects and advantages of this invention, may be obtained will be better understood after a consideration of the following discussion and the single figure of the drawing which is a schematic diagram of an embodiment of this invention having a single electron discharge device.

In the embodiment of the invention illustrated in the drawing, a regenerative oscillatory path is formed by connecting one end of a parallel resonant circuit 2 to the screen grid 4 of a pentagrid amplifier 6, coupling the other end of the circuit 2 via a blocking condenser 8 to the first grid 10. A filter for the A. G. C. voltage is formed by a resistor 12 and condenser 14 that are in series between the grid 10 and the grounded cathode 16. A grid leak resistor 18 may be connected between a point 20 of positive voltage and the grid 10 so as to provide an initial positive bias that overcomes the contact potential. If it were not for the action of the degenerative path to be described, the voltage at the grid 10 would be at a maximum negative value due to grid rectification.

A degenerative oscillatory path is formed through third grid 22, the suppressor grid 24, the plate 26 and the lead

28 to the side of the tuned circuit 2 that is coupled to the first grid 10. Positive operating voltage for the plate 26 is supplied via the tuned circuit 2 and a resistor 27 that is shunted for the oscillator frequency by a condenser 29. As the first grid tends to go positive, the plate 26 tends to go negative so as to effectively load the grid 10 and prevent oscillation from occurring in the regenerative path previously described. As the amplitude of the unamplified A. G. C. voltage applied to the third grid 22 becomes greater in amplitude, the gain of the degenerative path is reduced until a point is reached where oscillations are permitted to occur in the regenerative path. As the unamplified A. G. C. voltage becomes still more negative, the amplitude of oscillations in the regenerative path increases and the grid 10 becomes more negative. The negative voltage at the grid 10 is much larger in amplitude than the unamplified A. G. C. voltage applied to the grid 22. The condenser 14 bypasses any voltages of the oscillator frequency and cooperates with the resistor 12 to provide a smooth A. G. C. voltage to a bus 30.

In order to obtain a variable delay, the resonant tank circuit 2 is comprised of a condenser 32 connected in parallel with two serially connected inductance coils 34 and 36. The positive voltage for the plate 26 is connected at the junction 38 of the coils 34 and 36. A variable core 40 of magnetic material may be mounted so as to vary the relative inductances of the coils 34 and 36. The greater the inductance of the coil 34, the greater is the impedance presented to the plate 26, the greater is the effect of the degenerative path and the greater is the amount of delay introduced in the amplified A. G. C. voltage on the bus 30.

It will be apparent to one skilled in the art, that the frequency of oscillation of the regenerative path may be selected so as to produce a minimum of interference in the equipment in which the A. G. C. amplifier is used.

While I have illustrated a particular embodiment of my invention, it will of course be understood that I do not wish to be limited thereto since various modifications both in the circuit arrangement and in the instrumentalities may be made, and I contemplate by the appended claims to cover any such modifications as fall within the true spirit and scope of the invention.

What I claim as new and desire to secure by Letters Patent of the United States is:

1. An amplifier for increasing the amplitude of a negative voltage comprising in combination an electron tube having a cathode, a first grid, a screen grid, a third grid and a plate, a source of reference potential, means for connecting said cathode to said source, a filter comprised of a first resistor and a first condenser connected in series in the order named between said first grid and said cathode, a source of fixed potential that is positive with respect to said reference potential, a second resistor connected between said source of positive potential and said first grid, a tank circuit having a first and a second terminal and comprised of a third condenser and an inductance connected in parallel between said terminals, a fourth condenser connected between said first terminal and said first grid, means for coupling said plate to said first terminal, means for coupling said second terminal of said tank circuit to said second grid, and means for coupling said source of positive potential to an intermediate point on said inductance of said tank circuit.

2. An amplifier as set forth in claim 1 wherein a moveable magnetic core is provided for said inductance of said tank circuit so as to vary the impedance level of the intermediate point to which said source of positive potential is coupled and hence provide a delay for the amplified automatic gain control voltage appearing at said first grid.

3. An amplifier as set forth in claim 1 wherein means are provided for varying the relative amount of impedance of said tank circuit on either side of said intermediate point so as to provide a delay for the automatic gain control voltage appearing at said first grid.

4. An amplifier for direct current voltages comprising in combination an electron tube having a cathode, an anode and first, second and third grids inserted therebetween, a resonant circuit comprised of a capacitor and an inductor connected in parallel, means for coupling said resonant circuit to said cathode, said first grid and said second grid in such manner as to comprise an oscillator and hence capable by itself of modulating the intensity of electrons flowing toward said anode, a connection between said anode and a point on said resonant circuit at which the oscillations are out of phase with the variations in the density of electrons arriving at said anode, a source of positive operating potential, and a connection between it and an intermediate point on said inductor.

5. An amplifier as set forth in claim 4 wherein the out of phase energy supplied to said resonant circuit by said connection is sufficient to prevent oscillations with no potential applied to said third grid.

6. An amplifier as set forth in claim 5 in which means are provided to vary the relative amounts of inductance of said inductor on either side of said intermediate point so as to vary accordingly the magnitude of the negative potential applied to said third grid at which oscillations occur in said oscillator.

References Cited in the file of this patent

UNITED STATES PATENTS

| | | |
|---|---|---|
| 2,051,177 | Rath | Aug. 18, 1936 |
| 2,119,357 | Schalkwijk | May 31, 1938 |
| 2,255,190 | Ryall | Sept. 9, 1941 |
| 2,262,916 | Boucke | Nov. 18, 1941 |
| 2,312,139 | Weagant | Feb. 23, 1943 |
| 2,346,545 | Anderson | Apr. 11, 1944 |
| 2,621,264 | Hultberg | Dec. 9, 1952 |